United States Patent
Lee et al.

(10) Patent No.: US 7,229,881 B2
(45) Date of Patent: Jun. 12, 2007

(54) DYNAMIC RANDOM ACCESS MEMORY OF SEMICONDUCTOR DEVICE AND METHOD FOR MANUFACTURING THE SAME

(75) Inventors: Sang Don Lee, Gyeonggi-do (KR); Yil Wook Kim, Seoul (KR); Jin Hong Ahn, Gyeonggi-do (KR)

(73) Assignee: Hynix Semiconductors, Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 11/165,180

(22) Filed: Jun. 24, 2005

(65) Prior Publication Data

US 2006/0024888 A1    Feb. 2, 2006

(30) Foreign Application Priority Data

Jul. 29, 2004    (KR) .................. 10-2004-0059750

(51) Int. Cl.
*H01L 21/336* (2006.01)
(52) U.S. Cl. .............. 438/257; 438/239; 257/296; 257/369; 257/E27.084
(58) Field of Classification Search ........ 257/369, 257/296, E27.084; 438/257, 239
See application file for complete search history.

(56) References Cited

U.S. PATENT DOCUMENTS

| | | | | |
|---|---|---|---|---|
| 6,955,952 | B2 * | 10/2005 | Yeo et al. | 438/154 |
| 7,067,369 | B2 * | 6/2006 | Lee | 438/216 |
| 7,087,476 | B2 * | 8/2006 | Metz et al. | 438/199 |
| 2005/0205939 | A1 * | 9/2005 | Lee et al. | 257/371 |
| 2005/0230740 | A1 * | 10/2005 | Lee | 257/315 |
| 2006/0008959 | A1 * | 1/2006 | Hagemeyer et al. | 438/197 |
| 2006/0157755 | A1 * | 7/2006 | Lee et al. | 257/288 |

OTHER PUBLICATIONS

Jiankang Bu et al., "Retention Reliability Enhanced SONOS NVSM with Scaled Programming Voltage", IEEE, 2002, pp. 5-2383-5-2389, vol. 5.
Takeshi Hamamoto et al., On the Retention Time Distribution of Dynamic Random Access Memory (DRAM); IEEE, Jun. 1998, pp. 1300-1309, vol. 45, No. 6.

* cited by examiner

*Primary Examiner*—Thao P. Le
(74) *Attorney, Agent, or Firm*—Johnny Kumar; Justin Darrow; Heller Ehrman, LLP (57) ABSTRACT

The present invention discloses an improved DRAM of semiconductor device and method for manufacturing the same wherein an ONO (oxide-nitride-oxide) structure for trapping electrons or holes used in a non-volatile memory is employed in a gate insulating film of the DRAM to reduce impurity concentrations of a channel region and a well region.

7 Claims, 10 Drawing Sheets

DYNAMIC RANDOM ACCESS MEMORY OF SEMICONDUCTOR DEVICE AND METHOD FOR MANUFACTURING THE SAME

CROSS-REFERENCE TO RELATED APPLICATION

This application claims the benefit of Korea Patent Application No. 10-2004-0059750, filed Jul. 29, 2004, the contents of which are hereby incorporated herein by reference in their entirety.

BACKGROUND OF THE INVENTION

1. Field of the Invention

The present invention relates to DRAM (Dynamic Random Access Memory) of semiconductor device and method for manufacturing the same, and in particular to an improved DRAM of semiconductor device and method for manufacturing the same wherein a gate insulating film having an ONO (oxide-nitride-oxide) structure is employed to reduce impurity concentrations of a channel region and a well region and improve a leakage current and a refresh characteristics of the device.

2. Description of the Related Art

Figure 1:
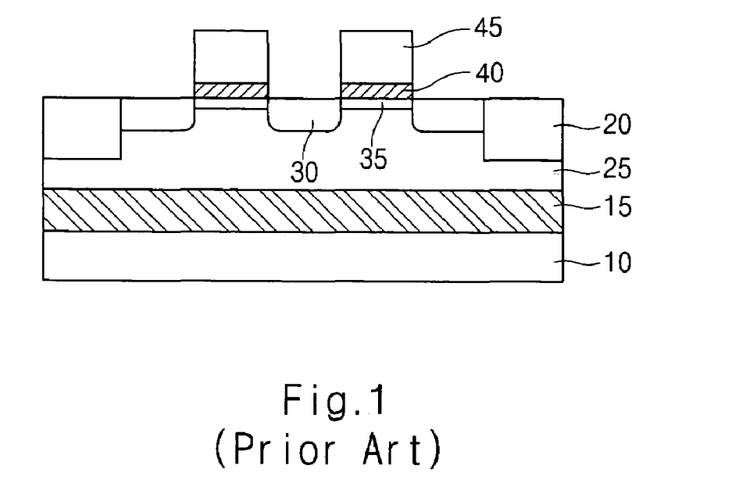
FIG. 1 is a cross-sectional view illustrating a structure of a conventional DRAM of semiconductor device.

FIG. 1 is a cross-sectional view illustrating a structure of a conventional DRAM of semiconductor device.

Referring to FIG. 1, the conventional DRAM comprises a device isolation film 20, a deep n-well 15 and a p-well 25 disposed on a semiconductor substrate 10. The conventional DRAM also comprises a stacked structure of a gate oxide film 40 and a gate electrode 45, and a channel region 45 disposed in the semiconductor substrate 10 below the gate electrode 45. A source/drain region 30 is disposed in the semiconductor substrate 10 at both sides of the gate electrode 45.

In the conventional DRAM, a channel length and a channel width decrease as the dimension of the DRAM cell is reduced. The drawbacks of the shrinkage are that a threshold voltage of a cell transistor is decreased and a punch-through phenomenon is easily induced. In order to overcome these problems, a method for increasing impurity concentrations of a channel region and a well region has been proposed.

Generally, the threshold voltage of a cell transistor is defined in Equation 1.

$$V_{TH} = \Phi_{MS} - \frac{Q_{EFF}}{C_{OX}} + 2 \cdot |\Phi_F| - \frac{Q_B}{C_{OX}} = \qquad \text{[Equation 1]}$$

$$\Phi_{MS} - \frac{Q_{EFF}}{C_{OX}} + 2 \cdot |\Phi_F| + 2 \cdot \frac{\sqrt{\varepsilon_S \cdot q \cdot N_A \cdot |\Phi_F|}}{C_{OX}},$$

where $\Phi_{MS}$ is work function difference between the gate electrode and the semiconductor substrate, $Q_{EFF}$ is effective charge per unit area of the gate oxide when $V_G = V_{TH}$, $C_{OX}$ is capacitance per unit area of the gate oxide, $\Phi_F$ is Fermi level of the semiconductor substrate, $\Phi_B$ is charge per unit area of the depletion region, $\varepsilon_S$ is permittivity constant of the semiconductor substrate, q is charge of one electron, and $N_A$ is impurity concentration of the semiconductor substrate.

$Q_{EFF}$ is defined in Equation 2 below.

$$Q_{EFF} = Q_{SS} + Q_{it(\Phi_S = 2\Phi_F)} + \int_0^{T_{OX}} \frac{x \cdot \rho(x)}{T_{OX}} \cdot dx, \qquad \text{[Equation 2]}$$

where $Q_{SS}$ is surface state fixed charge at the interface between the gate oxide film and the semiconductor substrate, $Q_{it}$ is interface state charge between the gate oxide film and the semiconductor substrate, $\Phi_S$ is surface potential of the semiconductor substrate, $\rho(\chi)$ is oxide charge density within the gate oxide, and $T_{OX}$ is thickness of the gate oxide.

Therefore, the threshold voltage of the cell transistor can be obtained from Equation 3.

$$V_{TH} = \qquad \text{[Equation 3]}$$

$$\Phi_{MS} - \frac{1}{C_{OX}} \left[ Q_{SS} + Q_{it(\Phi_S = 2\Phi_F)} + \int_0^{T_{OX}} \frac{x \cdot \rho(x)}{T_{OX}} \cdot dx \right] +$$

$$2 \cdot |\Phi_F| + 2 \cdot \frac{\sqrt{\varepsilon_S \cdot q \cdot N_A \cdot |\Phi_F|}}{C_{OX}}$$

Figure 2A:
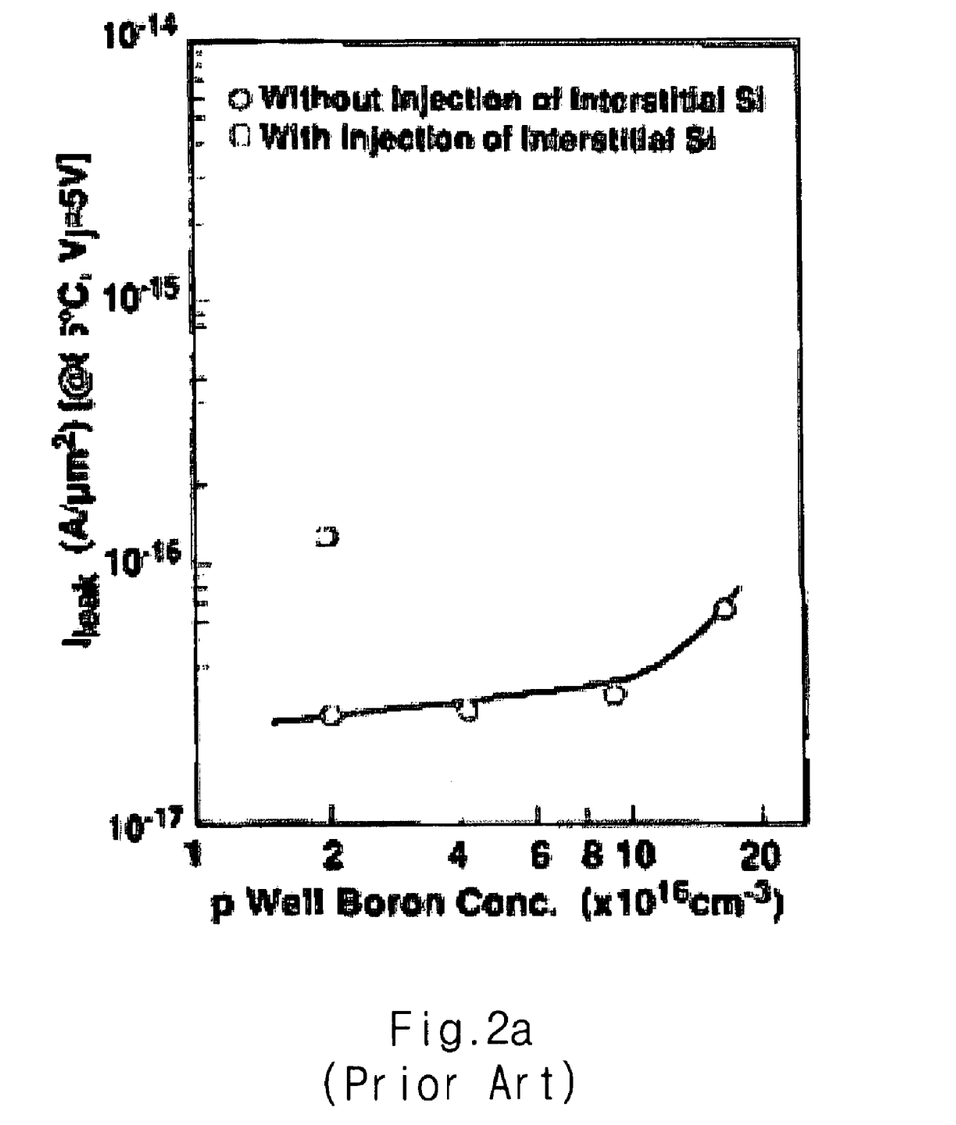
FIG. 2a is a graph showing an amount of a leakage current according to an impurity concentration of a channel region in the structure of the conventional DRAM of semiconductor device illustrated in FIG. 1.
Figure 2B:
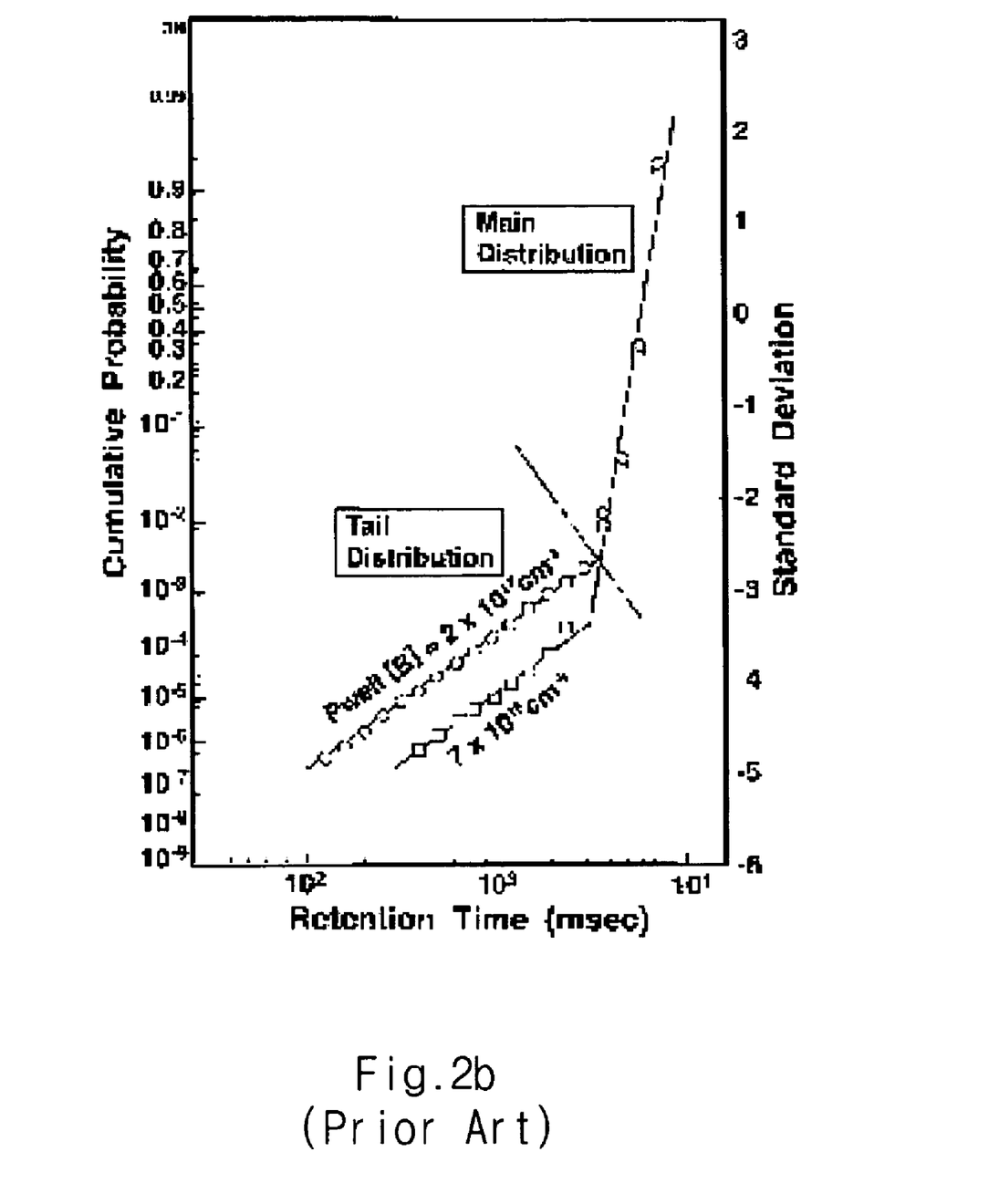
FIG. 2b is a graph showing a refresh characteristic according to an impurity concentration of a channel region in the structure of the conventional DRAM of semiconductor device illustrated in FIG. 1.

When the impurity concentrations of a channel region and a well region are increased, $N_A$ is increased. As a result, the threshold voltage and the punch-through voltage are increased, thereby overcoming the problems of the conventional art. However, as shown in FIGS. 2a and 2b, the increases in the threshold voltage and the punch-through voltage increase an electric field of a source/drain region, resulting in an increase in a leakage current and degrading a refresh characteristic of the DRAM. Therefore, the proposed method shows its limitation, and a leakage current characteristic and a refresh characteristic are considered when determining a proper impurity concentration.

However, it is very difficult to manufacture a DRAM of semiconductor device wherein the threshold voltage, the punch-through voltage and the refresh characteristic all meet desired level as the dimension of the DRAM is reduced to below 100 nm.

Figure 3:
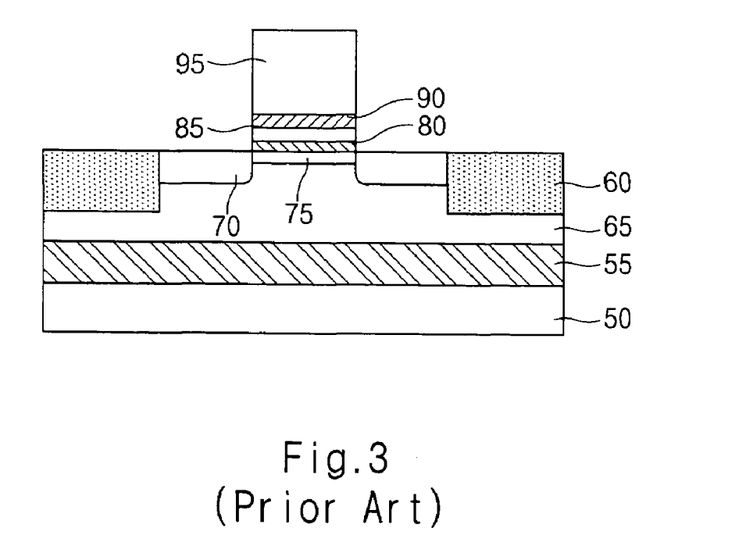
FIG. 3 is a cross-sectional view illustrating a conventional non-volatile memory cell.

FIG. 3 is a cross-sectional view illustrating a conventional non-volatile memory cell.

Referring to FIG. 3, the conventional non-volatile memory cell comprises a device isolation film 60, a deep n-well 55 and a p-well 65 disposed on a semiconductor substrate 50. The conventional non-volatile memory also comprises a stacked structure of a lower gate oxide film 80 and an intermediate gate nitride film 85, an upper gate oxide film 90 and a gate electrode 95, and a channel region 75 disposed in the semiconductor substrate 50 below the gate electrode 95. A source/drain region 70 is disposed in the semiconductor substrate 50 at both sides of the gate electrode 95.

The conventional non-volatile memory cell stores data by trapping electrons or holes in the intermediate gate nitride film. A threshold voltage changes in case whether electrons or holes are trapped or not. That is, when electrons are trapped in the intermediate gate nitride film, the threshold voltage is increased and when holes are trapped, the threshold voltage is decreased. '1' or '0' can be stored in the non-volatile memory cell using this principle.

For example, when in case of trapping electrons are defined as '1' and trapping holes as '0' (or vice versa), the operation of the non-volatile memory cell is shown in Table 1 below.

TABLE 1

| Operation | Gate [V] | Drain (V) | Source [V] | Bulk (p-well) [V] | |
|---|---|---|---|---|---|
| ERASE | $V_P$ | 0 | 0 | 0 | Write '1' |
| PROGRAM | 0 | $V_P$ | $V_P$ | $V_P$ | Write '0' |
| READ | $V_{RG}$ | $V_{RD}$ | 0 | 0 | $V_{RG}, V_{RD} < V_P$ |

During an ERASE operation, $V_P$ is applied to the gate electrode and 0V is applied to the drain, the source, the bulk so that the voltage difference between the gate electrode and other contacts is $V_P(>0)$, whereby electrons flow from the drain, the source, the bulk into the ONO gate insulating film to be trapped in the ONO gate insulating film. Therefore, the threshold voltage is increased according to Equation 3 and '1' is stored.

During a PROGRAM operation, 0V is applied to the gate electrode and $V_P$ is applied to the drain, the source, the bulk so that the voltage difference between the gate electrode and other contacts is $-V_P(<0)$, whereby holes flow from the drain, the source, the bulk into the ONO gate insulating film to be trapped in the ONO gate insulating film. Therefore, the threshold voltage is decreased according to Equation 3 and '0' is stored.

During a READ operation, when VRD is applied to the drain, the threshold voltage is greater than VRG in case that '1' is stored and the threshold voltage is smaller than VRG in case that '0' is stored. Therefore, '1' or '0' can be read out when VRG is applied to the gate electrode since the transistor is turned off or on according to the threshold voltage.

In case of a non-volatile memory cell, since the state of the electrons or holes trapped in the intermediate gate nitride film are maintained even when power is cut off, the data can be read out from the transistor when power is again applied to the transistor.

However, a non-volatile memory cell requires a high $_{VP}$ in order to trap electrons or holes during the ERASE or the PROGRAM operation, which is a write operation. Such a write operation also requires 1000 times longer time period compared to the READ operation. Moreover, the amount of electrons or holes trapped in the intermediate gate nitride film decreases as READ or PROGRAM operations are repeatedly performed. Therefore, non-volatile memory cells cannot be used in a DRAM of semiconductor device having frequent read/write operations.

As described above, in accordance with the conventional DRAM of semiconductor device and method for manufacturing the same, wherein a gate insulating film having an ONO (oxide-nitride-oxide) structure is employed to reduce impurity concentrations of a channel region and a well region and improve a leakage current and a refresh characteristics of the device.

SUMMARY OF THE INVENTION

Accordingly, it is an object of the present invention to provide DRAM of semiconductor device and method for manufacturing the same, wherein In order to achieve the above-described object of the invention, there is provided a method for manufacturing DRAM semiconductor device, the method comprising the steps of:

(a) providing a semiconductor substrate having a first region, a second region, and a channel region disposed in the first region and the second region, the first region including a cell region and the second region including a pMOS region and a nMOS region, (b) sequentially forming a lower gate oxide film, an intermediate gate insulating film including a electron/hole trap and a buffer oxide film, (c) at least removing the buffer oxide film and the intermediate gate insulating film in the nMOS region of the pMOS region and the nMOS region to expose a portion of the lower gate oxide film in the second region, (d) at least removing a predetermined thickness of the buffer oxide film and the entire exposed lower gate oxide film in the second region, (e) forming an upper gate oxide film on the intermediate gate insulating film and at least on the semiconductor substrate in the nMOS region of the pMOS region and the nMOS region, and (f) forming a gate electrode pattern on the upper gate oxide film in the first and the second region.

In order to achieve the above-described object of the invention, there is provided a DRAM of semiconductor device, comprising:

a semiconductor substrate having a first region and a second region, the second region including a pMOS region and an nMOS region, a stacked structure of a lower gate oxide film and an intermediate gate insulating film including an electron/hole trap disposed at least on the first region of the first region and the pMOS region of the second region, a stacked structure of an upper gate oxide film and a gate electrode pattern disposed on the intermediate gate insulating film and at least on the semiconductor substrate in the nMOS region of the pMOS region and the nMOS region of the second region, and a channel region disposed in the semiconductor substrate under below the gate electrode pattern.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE EXEMPLARY EMBODIMENTS

A DRAM of semiconductor device and method for manufacturing the same in accordance with preferred embodiments of the present invention will now be described in detail with reference to the accompanying drawings.

FIGS. 4a through 4f are cross-sectional views illustrating a method for manufacturing a DRAM of semiconductor device in accordance with a first preferred embodiment of the present invention.

Figure 4A:
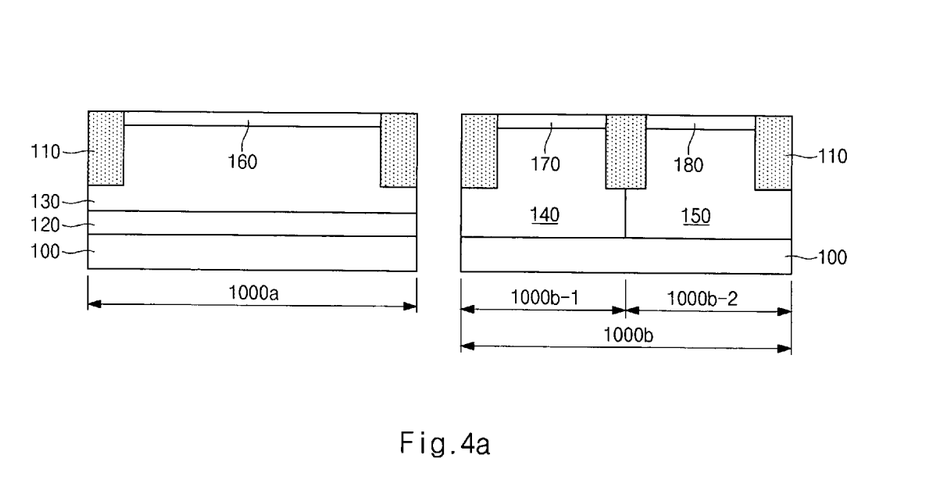
FIGS. 4A through 4F are cross-sectional views illustrating a method for manufacturing a DRAM of semiconductor device in accordance with a first preferred embodiment of the present invention.

Referring to FIG. 4a, a device isolation film 110 is formed on a semiconductor substrate 100 to define an active region. Thereafter, impurities are implanted into the semiconductor substrate 100 to form a deep n-well 120 and a p-well 130, thereby defining a first region 1000a including a cell region where a cell transistor is formed, and a n-well 140 and a p-well 150, thereby defining a second region 1000b which is a core/peripheral circuit region including a pMOS region 1000b-1 and a nMOS region 1000b-2. Impurities are then implanted into the semiconductor substrate 100 to form a cell channel region 160 in the first region 1000a and a pMOS channel region 170 and a nMOS channel region 170 in the second region the semiconductor substrate 1000b.

Figure 4B:
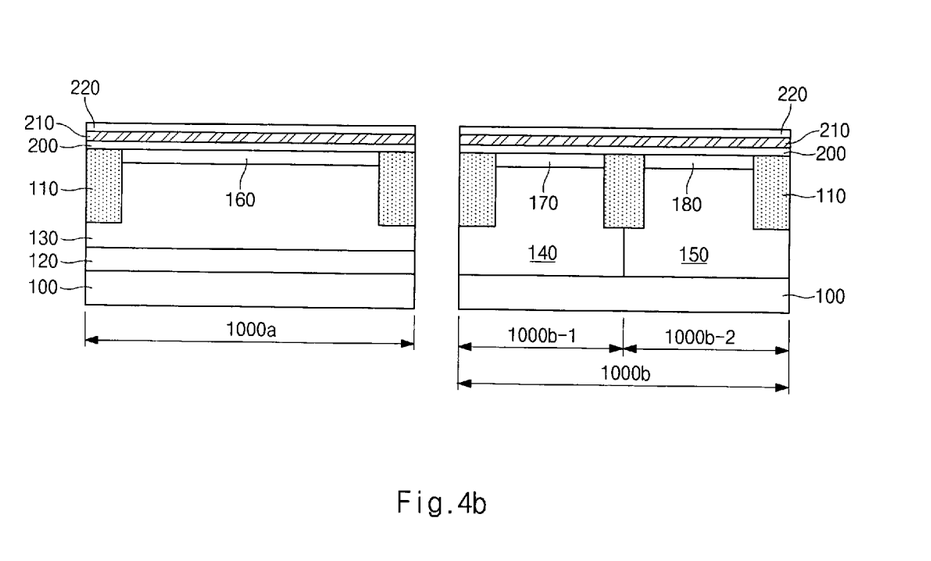

Referring to FIG. 4b, a lower gate oxide film 200, an intermediate gate insulating film 210 including a electron/hole trap and a buffer oxide film 220 are sequentially formed on the semiconductor substrate 100 including the first region 1000a and the second region 1000b. The thicknesses of the lower gate oxide film 200 and the intermediate gate insulating film 210 may be adjusted so that the thickness of the upper gate oxide film 230 formed in the second region 1000b and a tri-layer equivalent oxide thickness of the lower gate oxide film 200, the intermediate gate insulating film 210 and the upper gate oxide film 230 formed in the first region 1000a are properly adjusted since the thickness of the upper gate oxide film 230 formed on the semiconductor substrate 100 in the second region 1000b is greater than that of the upper gate oxide film 230 formed on the intermediate gate insulating film 210 in the first region 1000a. Preferably, a thickness of the lower gate oxide film 200 is equal to or less than 100 Å, and a thickness of the intermediate gate insulating film 210 ranges from 5 to 100 Å. Preferably, the intermediate gate insulating film 210 is selected from a group consisting of a nitride film, an $Al_2O_3$ film, an $HfO_2$ film and combinations thereof.

Figure 4C:
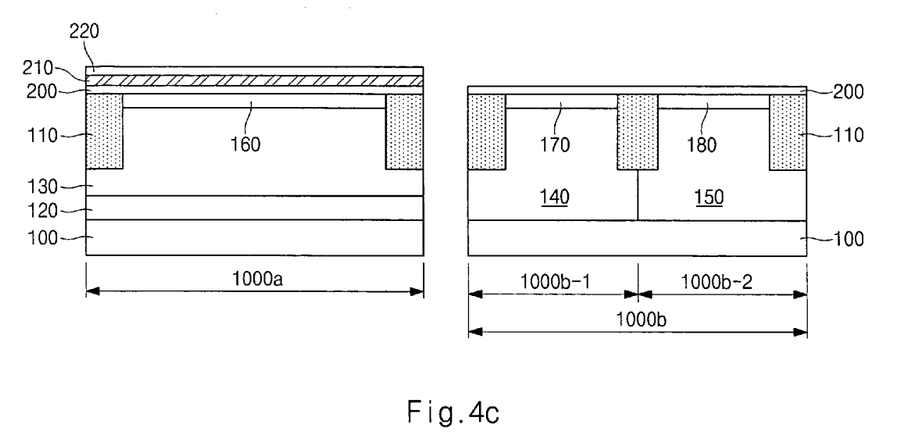

Referring to FIG. 4c, a photoresist film pattern (not shown) covering the first region 1000a is formed. Thereafter, the buffer oxide film 220 and the intermediate gate insulating film 210 in the pMOS region 1000b-1 and nMOS region 1000b-2 of the second region 1000b are removed by etching to expose a portion of the lower gate oxide film 200 in the second region 1000b. The remaining photoresist film pattern is then removed.

Figure 4D:
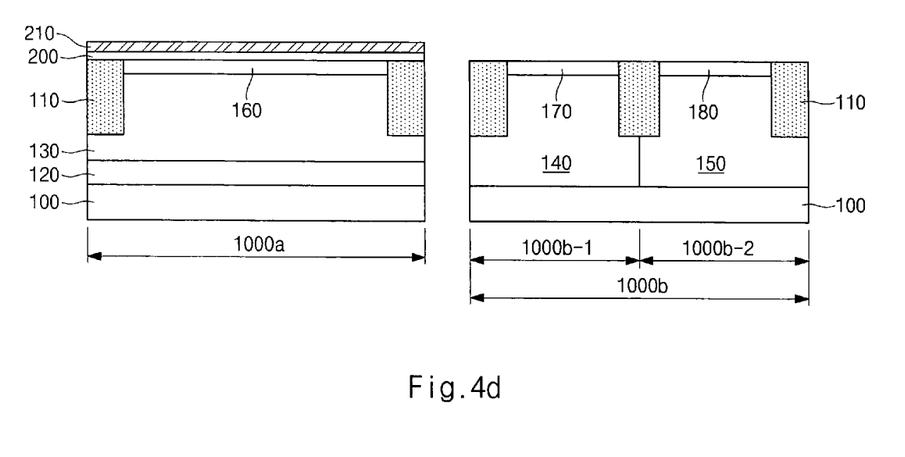

Referring to FIG. 4d, the buffer oxide film 220 in the first region 1000a and the lower gate oxide film 200 in the second region 1000b are removed by etching. Preferably, during the formation process of the buffer oxide film 220 shown in FIG. 4b, the buffer oxide film 220 is formed thicker than the lower gate oxide film 200 so that only a predetermined thickness of the buffer oxide film 220 is etched while the lower gate oxide film 200 entirely removed.

Figure 4E:
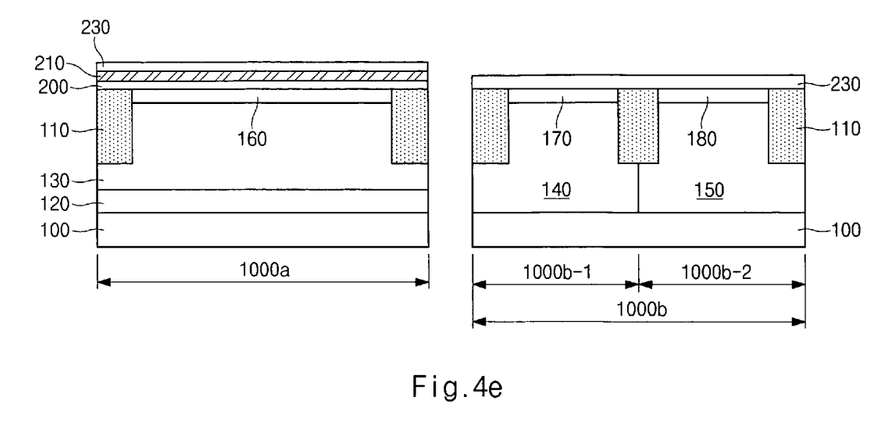

Referring to FIG. 4e, an upper gate oxide film 230 is formed on the intermediate gate insulating film 210 in the first region 1000a and on the semiconductor substrate 100 of the second region 1000b. Preferably, a thickness of the upper gate oxide film 230 in the first region 1000a is equal to or less than that on the semiconductor substrate 100 in the second region 1000b, which ranges form 10 to 400 Å.

Figure 4F:
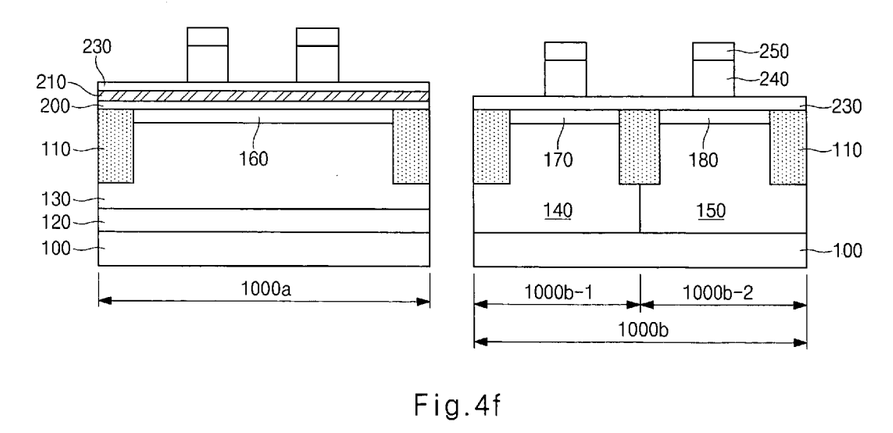

Referring to FIG. 4f, a stacked structure of a gate conductive layer and a CVD insulating film is formed on the upper gate oxide film 230 in the first region 1000a and the second region 1000b and then patterned to form a gate electrode pattern comprising a stacked structure of a gate conductive layer pattern 240 and a CVD insulating film pattern 250. Preferably, the gate conductive layer comprises a stacked structure of a lower conductive layer selected from a group consisting of a polysilicon film, a polycrystalline SiGe film and an upper conductive layer selected from a group consisting of $WSi_x$ layer, $NiSi_x$ layer, $CoSi_x$ layer, WN/W layer and TiN/W layer. In addition, the upper gate oxide film 230 and the intermediate gate insulating film 210 in the first region 1000a may also be simultaneously patterned during the patterning process of the gate conductive layer and the CVD insulating film.

Although not shown, a source/drain region (not shown) is formed on the semiconductor substrate 100 in a subsequent process. Thereafter, a landing plug formation process, a bit line contact formation process, a bit line formation process, a storage electrode contact formation process, a capacitor formation process, a metal line contact formation process and a metal line formation process may be performed.

Figure 5:
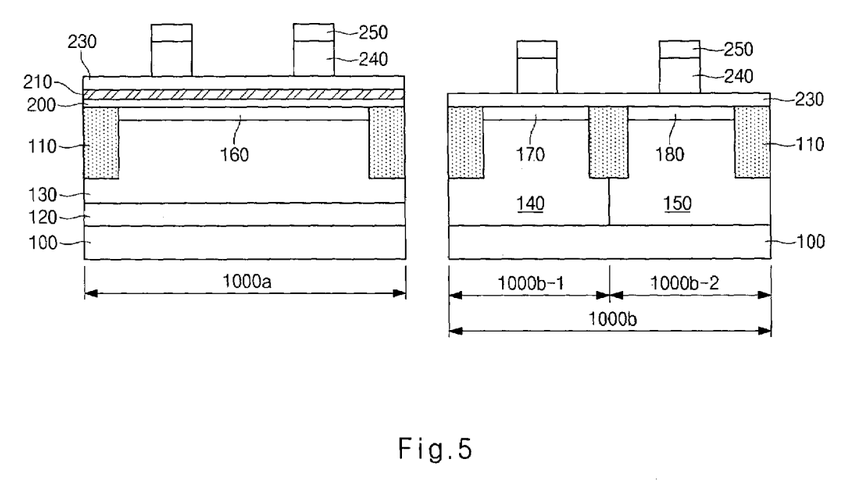
FIG. 5 is a cross-sectional view illustrating the DRAM of semiconductor device in accordance with the first preferred embodiment of the present invention.

FIG. 5 is a cross-sectional view illustrating the DRAM of semiconductor device in accordance with the first preferred embodiment of the present invention.

Referring to FIG. 5, a DRAM of semiconductor device of the present invention comprises a semiconductor substrate 100 having a device isolation film 110 defining an active region. A stacked structure of a lower gate oxide film 200, an intermediate gate insulating film 210 including a electron/hole trap and a upper gate oxide film 230 is disposed in a first region 1000a including a cell region. A gate electrode pattern comprising a stacked structure of a gate conductive layer pattern 240 and a CVD insulating film pattern 250 is disposed on the upper gate oxide film 230. A cell channel region 160 is disposed on the semiconductor substrate 100 below the gate electrode pattern.

The upper gate oxide film 230 is disposed in a second region 1000b including a pMOS region 1000b-1 and an nMOS region 1000b-2. The gate electrode pattern comprising a stacked structure of the gate conductive layer pattern 240 and the CVD insulating film pattern 250 is disposed on the upper gate oxide film 230. A pMOS channel region 170 and an nMOS channel region 180 are disposed under the gate electrode pattern.

Although not shown, the DRAM of semiconductor device in accordance with the first preferred embodiment may further comprise a source/drain region (not shown) in the semiconductor substrate 100 at both sides of the gate electrode pattern. The thicknesses and the materials of the lower gate oxide film, the lower gate oxide film 200, the intermediate gate insulating film 210, the buffer oxide film 220 and the gate electrode pattern are the same as those described in FIGS. 4a through 4f, therefore omitted.

FIGS. 6a through 6d are cross-sectional views illustrating a method for manufacturing a DRAM of a semiconductor device in accordance with a second preferred embodiment of the present invention.

The processes shown in FIGS. 4a and 4b are performed to form a structure shown in FIG. 4b.

Figure 6A:
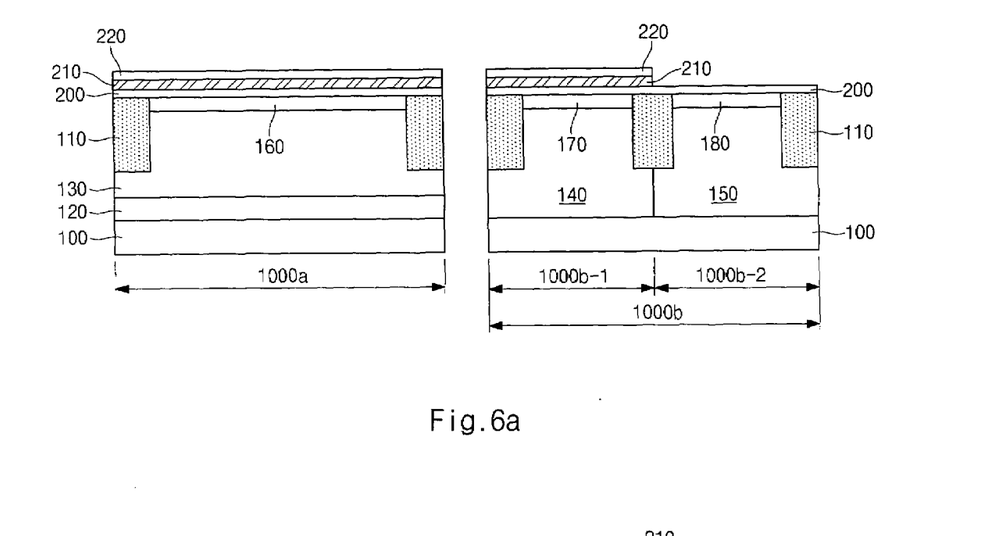
FIGS. 6A through 6D are cross-sectional views illustrating a method for manufacturing a DRAM of semiconductor device in accordance with a second preferred embodiment of the present invention.
Figure 6B:
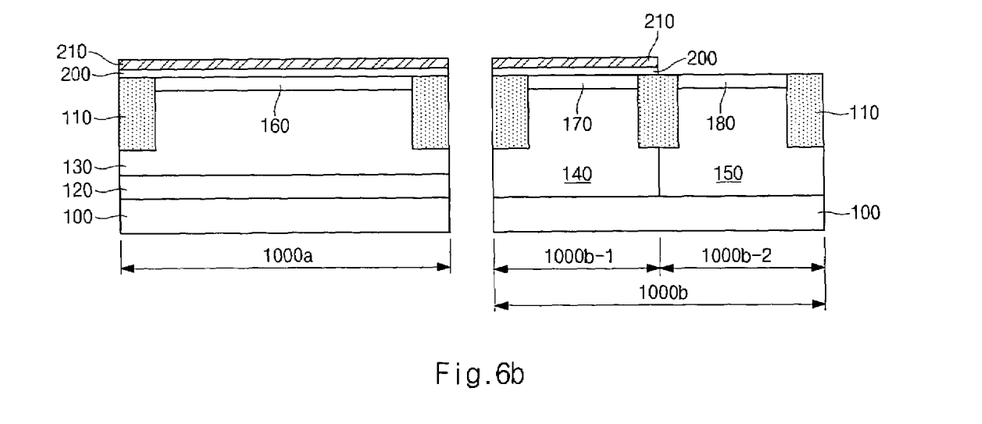

Now referring to FIG. 6a, a photoresist film pattern (not shown) covering the first region 1000a and the pMOS region 1000b-1 of the second region 1000b are formed. Thereafter, the buffer oxide film 220 and the intermediate gate insulating film 210 in the nMOS region 1000b-2 of the second region 1000b are removed by etching to expose a portion of the lower gate oxide film 200. The photoresist film pattern is then removed. Thereafter, the buffer oxide film 220 in both the first region 1000a and the pMOS region 1000b-1 of the second region 1000b and the lower gate oxide film 200 in the nMOS region 1000b-2 of the second region 1000b are simultaneously removed by etching. Preferably, during the formation process of the buffer oxide film 220 shown in FIG. 4b, the buffer oxide film 220 is formed thicker than the lower gate oxide film 200 so that only a predetermined thickness of the buffer oxide film 220 is etched while the lower gate oxide film 200 are entirely removed.

Figure 6C:
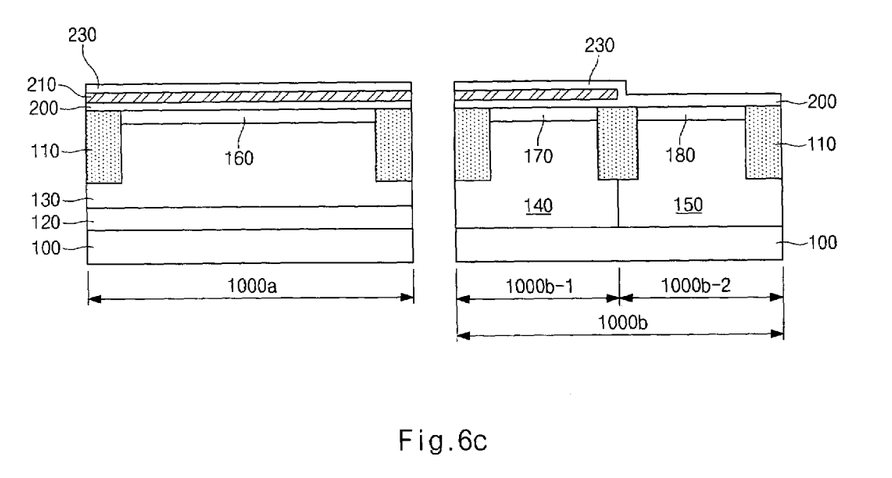

Referring to FIG. 6c, an upper gate oxide film 230 is formed on the intermediate gate insulating film 210 in both the first region 1000a and the pMOS region 1000b-1 of the second region 1000b, and on the semiconductor substrate 100 in the nMOS region 1000b-2 of the second region 1000b.

Figure 6D:
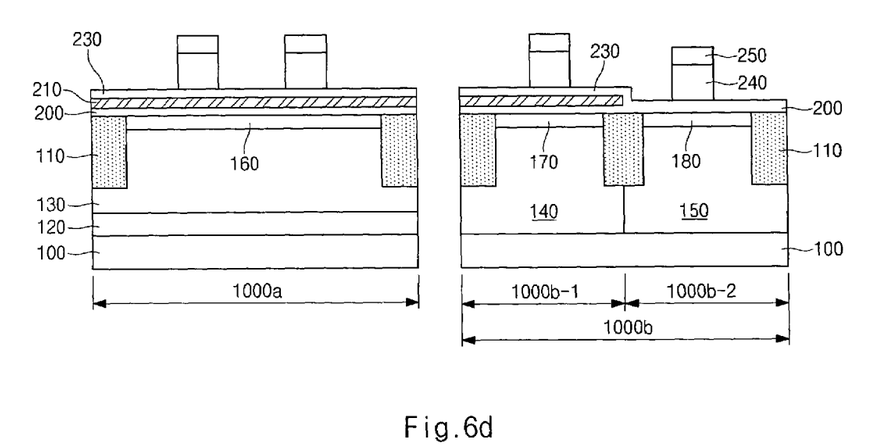

Referring to FIG. 6d, a gate electrode pattern comprising a stacked structure of a gate conductive layer pattern 240 and a CVD insulating film pattern 250 is formed using a method similar to that shown in FIG. 4f.

Although not shown, a source/drain region (not shown) is formed on the semiconductor substrate 100 in a subsequent process. Thereafter, a landing plug formation process, a bit line contact formation process, a bit line contact formation process, a storage electrode contact formation process, a capacitor formation process, a metal line contact formation process and a metal line formation process may be performed.

Figure 7:
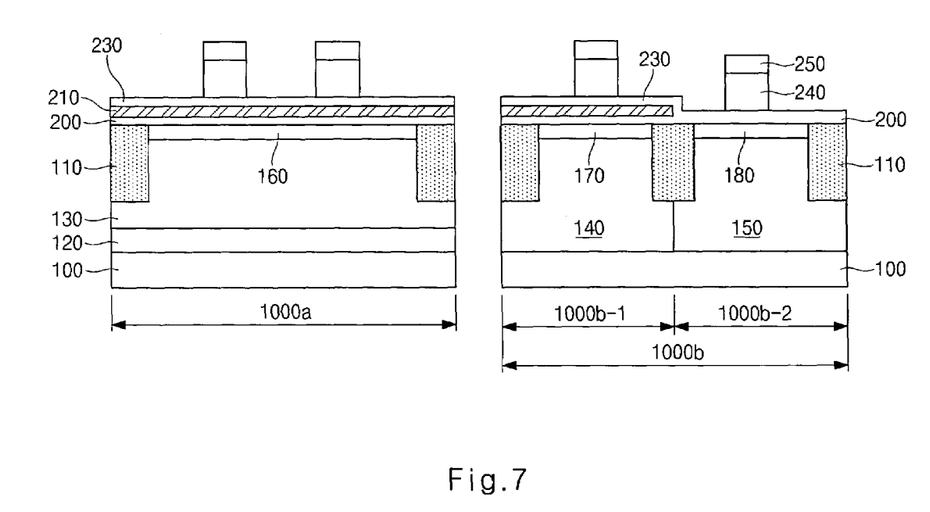
FIG. 7 is cross-sectional view illustrating the DRAM of semiconductor device in accordance with the second preferred embodiment of the present invention.

FIG. 7 is cross-sectional view illustrating the DRAM of semiconductor device in accordance with the second preferred embodiment of the present invention.

Referring to FIG. 7, a DRAM of semiconductor device of the present invention comprises a semiconductor substrate 100 having a device isolation film 110 defining an active region. A stacked structure of a lower gate oxide film 200, an intermediate gate insulating film 210 including a electron/hole trap and a upper gate oxide film 230 is disposed in a first region 1000a including a cell region. A gate electrode pattern comprising a stacked structure of a gate conductive layer pattern 240 and a CVD insulating film pattern 250 is disposed on the upper gate oxide film 230. A cell channel region 160 is disposed on the semiconductor substrate 100 below the gate electrode pattern.

A stacked structure of a lower gate oxide film 200, an intermediate gate insulating film 210 and an upper gate oxide film 230 is disposed in a pMOS region 1000b-1 of the second region 1000b. The upper gate oxide film 230 is disposed on the semiconductor substrate 100 in an nMOS region 1000b-2 of the second region 1000b. The gate electrode pattern comprising a stacked structure of the gate conductive layer pattern 240 and the CVD insulating film pattern 250 is disposed on the upper gate oxide film 230 in the pMOS region 1000b-1 and the nMOS region 1000b-2. A pMOS channel region 170 and an nMOS channel region 180 are disposed under the gate electrode pattern.

Although not shown, the DRAM of semiconductor device in accordance with the first preferred embodiment may further comprise a source/drain region (not shown) in the semiconductor substrate 100 at both sides of the gate electrode pattern. The thicknesses and the materials of the lower gate oxide film, the lower gate oxide film 200, the intermediate gate insulating film 210, the buffer oxide film 220 and the gate electrode pattern are the same as those described in FIGS. 4a through 4f and 6a through 6d, therefore omitted.

The operation of the DRAM of semiconductor device in accordance with the present invention will now be described in detail.

In accordance with the DRAM of semiconductor device of the present invention, electrons are trapped in the intermediate gate insulating film during its fabrication process, which increase the threshold voltage according to the Equation 3. When an impurity concentration of the channel region is decreased, NA in the Equation 3 is decreased whereby the increased threshold voltage is again decreased. Therefore, the refresh characteristic of the device is improved. While the ERASE or the PROGRAM operation is performed by trapping electrons or holes in the intermediate gate nitride film in case of a non-volatile memory, electrons trapped during the fabrication process of the DRAM of the present invention is used as means for reducing the impurity concentration of the channel region, not as means for writing data by trapping electrons or holes in the intermediate gate insulating film. Therefore, the read and write operations are the same as that of a conventional DRAM, which allows high-speed read/write operations.

In addition, the amount of trapped electrons or holes can be adjusted by applying a predetermined voltage to the word line after the manufacturing process of the DRAM is completed.

Table 2 below shows an example voltage that can be applied to the word line after the manufacturing process of the DRAM is completed for adjusting the threshold voltage.

TABLE 2

| Gate [V] | Bit line [V] | Storage node [V] | Bulk {V} | |
|---|---|---|---|---|
| $V_P$ | 0 | 0 | 0 or $V_{BB}$ | $V_{TH}$ is increased due to |
| $V_P$ | $V_P$ | 0 | 0 or $V_{BB}$ | electron injection |
| 0 or $V_N$ | $V_P$ | $V_P$ | $V_P$ | $V_{TH}$ is decreased due to |
| 0 or $V_N$ | $V_P$ | 0 | 0 or $V_{BB}$ | electron injection |

Referring to the Table 2, when voltages in the Table 2 are applied to respective contacts, the threshold voltage can be adjusted. Because the electrons trapped in the intermediate gate insulating film are maintained, the voltages in the Table 2 are required to be applied only once after the completion of manufacturing processes.

As discussed earlier, in accordance with the present invention, a gate insulating film having an ONO (oxide-nitride-oxide) structure is employed to reduce impurity concentrations of a channel region and a well region and improve a leakage current characteristic and a refresh characteristic of the device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for manufacturing DRAM of semiconductor device, the method comprising the steps of:

provifing a semiconductor substrate having a first region, a second region, and a channel region disposed in the first region and the second region, the first region including a cell region and the second region including a pMOS region and an nMOS region;

sequentially forming a lower gate oxide film, an intermediate gate insulating film including an electron/hole trap and a buffer oxide film;

at least removing the buffer oxide film and the intermediate gate insulating film in the nMOS region of the second region to expose a portion of the lower gate oxide film in the second region;

at least removing a predetermined thickness of the buffer oxide film and the entire exposed lower gate oxide film in the second region;

forming an upper gate oxide film on the intermediate gate insulating film and at least on the semiconductor substrate in the nMOS region of the pMOS region and the nMOS region;

forming a stacked structure of a gate conductive layer and a CVD insulating film; and patterning the stacked structure to form the gate electrode pattern.

2. The method according to claim 1, wherein the thickness of the lower gate oxide film is equal to or less than about 100.

3. The method according to claim 1, wherein the thickness of the intermediate gate insulating film ranges from about 5 Å to about 100.

4. The method according to claim 1, wherein the thickness of the upper gate oxide film in the first region is equal to or less than a thickness of the upper gate oxide film ranged from about 10 Å to about 400 on the semiconductor substrate in the second region.

5. The method according to claim 1, wherein the gate conductive layer comprises a stacked structure of a lower conductive layer and an upper conductive layer, the lower conductive layer selected from the group consisting of a polysilicon film and polycrystalline SiGe film, the upper conductive layer selected from the group consisting of $WSi_x$ layer, $NiSi_x$ layer, $CoSi_x$ layer, WN/W layer and TiN/W layer.

6. The method according to claim 1, wherein the patterning process of the stacked structure further comprises patterning the upper gate oxide film and the intermediate gate insulating film in the first region and the pMOS region of the second region.

7. The method according to claim 1, wherein the removing the buffer oxide film and the intermediate gate insulating film in the nMOS region of the second region comprises removing the buffer oxide film and the intermediate gate insulating film in the pMOS region and the nMOS region of the second region to expose a portion of the lower gate oxide film in the second region.

* * * * *